United States Patent
Lin

(10) Patent No.: US 7,743,817 B2
(45) Date of Patent: *Jun. 29, 2010

(54) THERMAL MODULE ALLOWING ADJUSTMENT IN THE HEIGHT OF HEAT SINK RELATIVE TO FIXING RACK

(75) Inventor: Sheng-Huang Lin, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 175 days.

This patent is subject to a terminal disclaimer.

(21) Appl. No.: 12/042,446

(22) Filed: Mar. 5, 2008

(65) Prior Publication Data

US 2009/0126904 A1  May 21, 2009

(30) Foreign Application Priority Data

Nov. 20, 2007 (TW) .............................. 96219608 U

(51) Int. Cl.
*F28F 7/00* (2006.01)
*H05K 7/20* (2006.01)

(52) U.S. Cl. ..................... 165/80.3; 165/78; 361/704; 361/709

(58) Field of Classification Search .............. 165/80.3, 165/78; 361/704, 709
See application file for complete search history.

(56) References Cited

U.S. PATENT DOCUMENTS

| 6,947,284 | B2 | | 9/2005 | Liu |
| 7,193,853 | B2 | | 3/2007 | Chen et al. |
| 7,262,969 | B2 | | 8/2007 | Lee et al. |
| 7,423,880 | B1 | * | 9/2008 | Tang ......................... 361/709 |
| 7,583,503 | B2 | * | 9/2009 | Lin ............................ 361/704 |
| 7,606,032 | B2 | * | 10/2009 | Lin ............................ 361/709 |
| 2009/0129023 | A1 | * | 5/2009 | Lin ............................ 361/704 |

\* cited by examiner

*Primary Examiner*—Cheryl J Tyler
*Assistant Examiner*—Brandon M Rosati

(57) ABSTRACT

A thermal module includes a fixing rack and a heat sink fitted in the fixing rack. The fixing rack is provided at an inner side with at least one stopper and at least one projected portion adjacent to and vertically lower than the stopper by distance. The heat sink is provided along an outer periphery at a predetermined position with at least one vertically extended groove. By vertically turning the heat sink by 180 degrees, the heat sink may be selectively fitted in the fixing rack with an upward-facing side thereof upward abutted on the upper stopper or the lower projected portion to restrict the fixing rack from sliding downward. Meanwhile, due to the height difference between the stopper and the projected portion, a distance between the upward-facing side of the heat sink and the fixing rack is adjustable.

3 Claims, 8 Drawing Sheets

THERMAL MODULE ALLOWING ADJUSTMENT IN THE HEIGHT OF HEAT SINK RELATIVE TO FIXING RACK

FIELD OF THE INVENTION

The present invention relates to a thermal module for radiating heat produced by an electronic device during the operation thereof, and more particularly to a thermal module allowing adjustment in the height of heat sink relative to fixing rack.

BACKGROUND OF THE INVENTION

Various kinds of electronic information products, such as computers, are very popular among people now, and provide a wide range of applications. Due to the increasing growth of market demands, electronic information industrial technologies are quickly developed to provide increased data processing and accessing speed. However, a large amount of heat is also produced during the high-speed operation of the parts in the electronic information products.

Taking a computer as an example, the central processing unit (CPU) produces more heat than other parts in the computer. When the produced heat increases, the CPU tends to have gradually decreased working efficiency. And, when the produced heat accumulates to exceed an allowable limit, the computer is subject to the risk of becoming down or even damaged. Moreover, to solve the problem of electromagnetic radiation, all the parts of the computer are enclosed in a case. Therefore, it is important to quickly dissipate the heat produced by the operating CPU and other heat-producing parts or elements in the electronic information products.

Generally, a heat sink is disposed atop the CPU to obtain the purpose of heat dissipation. The heat sink is provided at one side with a plurality of radiating fins, and is disposed on the CPU with another side without the radiating fins in direct contact with the CPU, so that heat produced by the CPU is transferred to and radiated from the radiating fins of the heat sink. A cooling fan may be optionally provided to produce airflow for carrying away the produced heat more quickly.

FIG. 1 is an assembled perspective view of a conventional thermal module 1. As shown, the thermal module 1 includes a fixing rack 11 and a plurality of radiating fins 12. The fixing rack 11 is a framework having two opposing covering flange 111 formed at a top thereof, so that the fixing rack 11 may cover the radiating fins 12 with an upper side 121 of the radiating fins 12 upward abutted on the covering flanges 111. The fixing rack 11 is then connected to the motherboard of the computer. With the fixing rack 11 of the conventional thermal module 1, the plurality of radiating fins 12 can be fitted in the fixing rack 11 only at a fixed height relative to the top of the fixing rack 11. That is, it is impossible to properly adjust the distance between the upper side 121 of the radiating fins 12 and the covering flanges 111 of the fixing rack 1 according to actual need. Therefore, the conventional thermal module 1 provides relatively low applicability. Sometimes, to meet different heat dissipation requirements, a user has to purchase different fixing racks 11 for using with the radiating fins 12. Therefore, the conventional fixing rack 11 is not economical for use and requires improvement.

SUMMARY OF THE INVENTION

A primary object of the present invention is to provide a thermal module that allows adjustment in the height of the heat sink relative to the fixing rack.

To achieve the above and other objects, the thermal module according to the present invention includes a fixing rack and a heat sink fitted in the fixing rack. The fixing rack is provided at an inner side with at least one stopper and at least one projected portion adjacent to and vertically lower from the stopper by a distance. The heat sink is provided along an outer periphery at a predetermined position with at least one vertically extended groove. By turning the heat sink vertically, the heat sink may be selectively fitted in the fixing rack with an upward-facing side thereof upward abutted on the stopper or the projected portion to restrict the fixing rack from sliding downward. And, due to the height difference between the stopper and the projected portion, the distance between the upward-facing side of the heat sink and the fixing rack may be changed. Therefore, the fixing rack of the thermal module of the present invention provides good applicability and is more economical for use.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
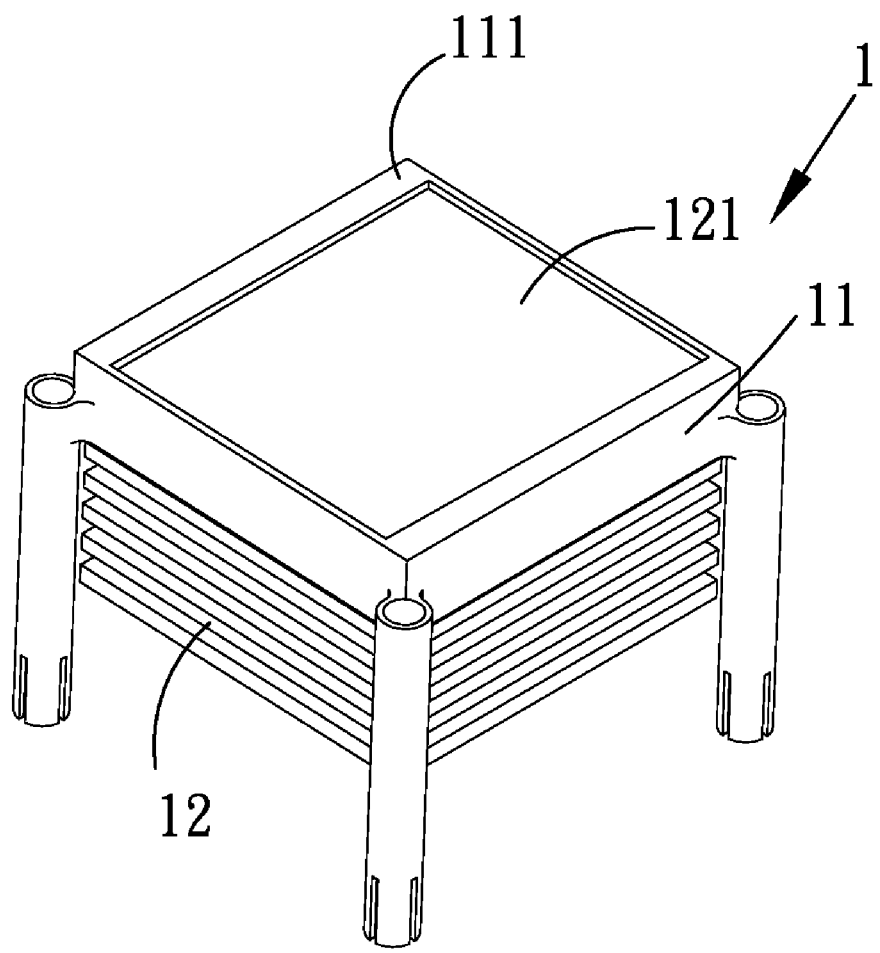
FIG. 1 is an assembled perspective view of a conventional thermal module.
Figure 2:
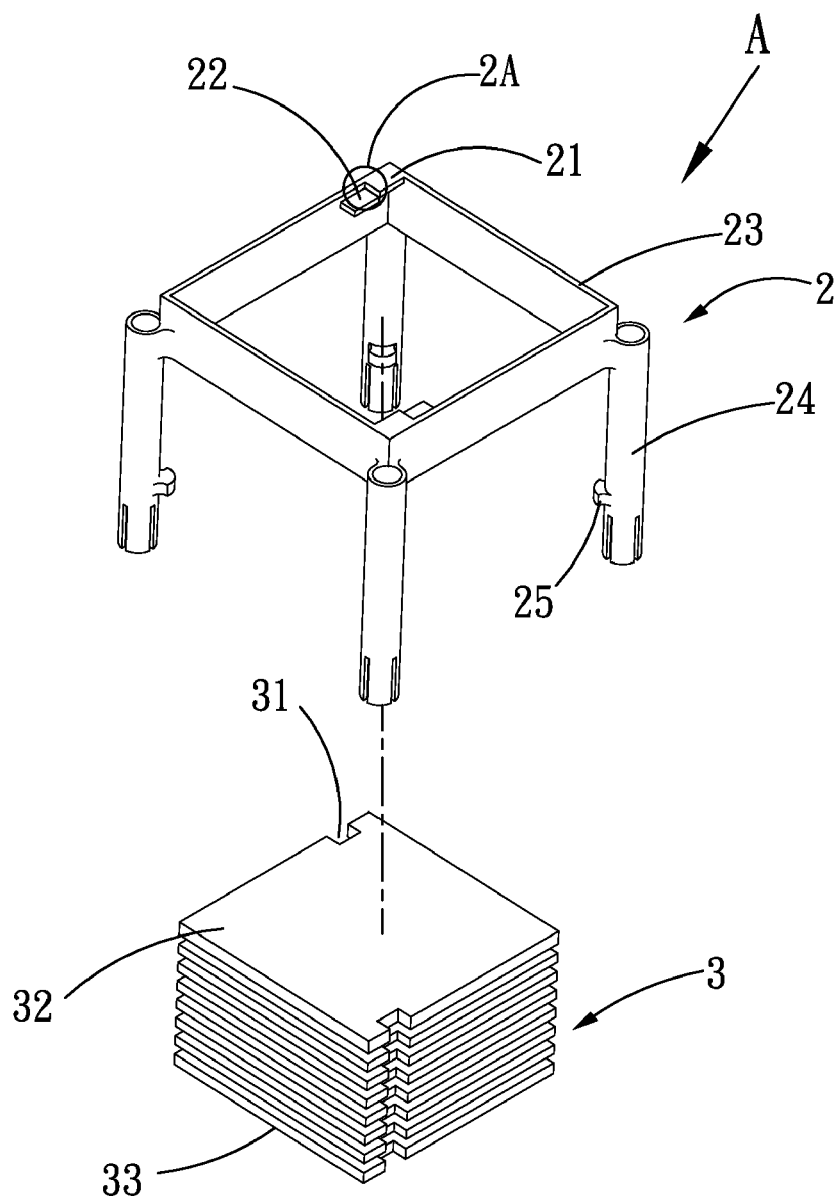
FIG. 2 is an exploded perspective view of a thermal module having a fixing rack and a heat sink according to a preferred embodiment of the present invention.
Figure 2A:
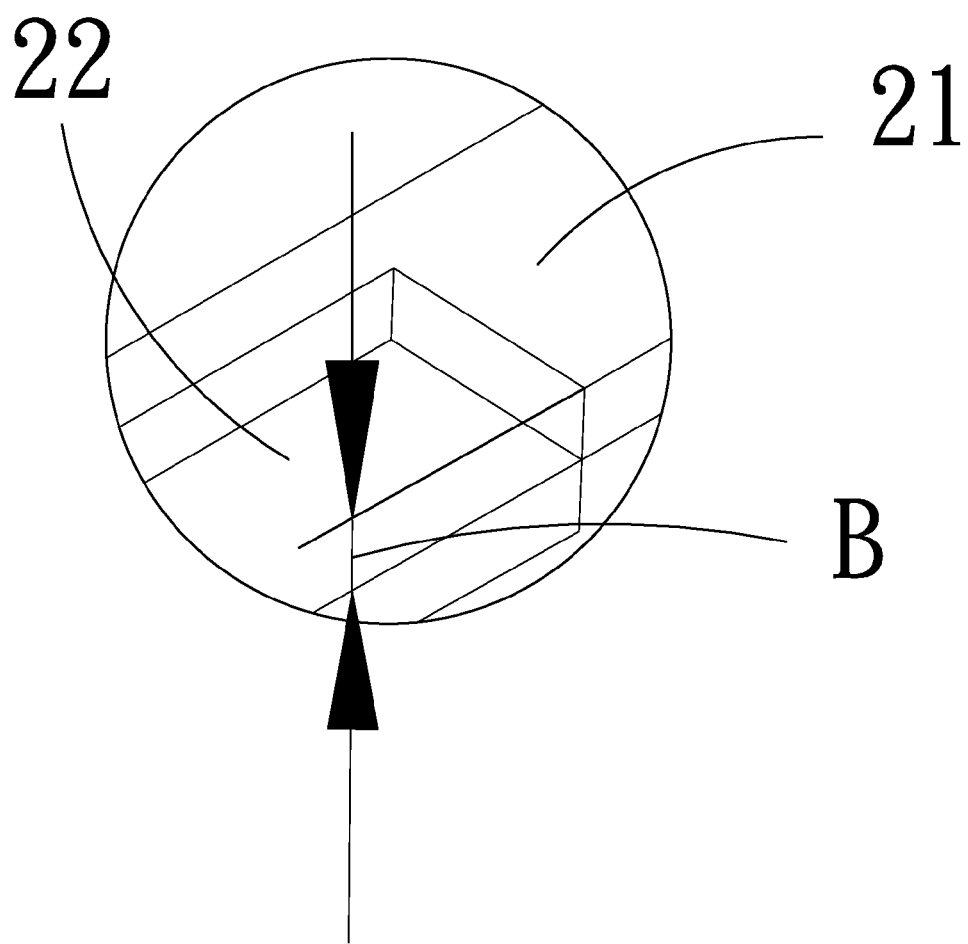
FIG. 2A is an enlarged view of the circled area in FIG. 2.
Figure 4:
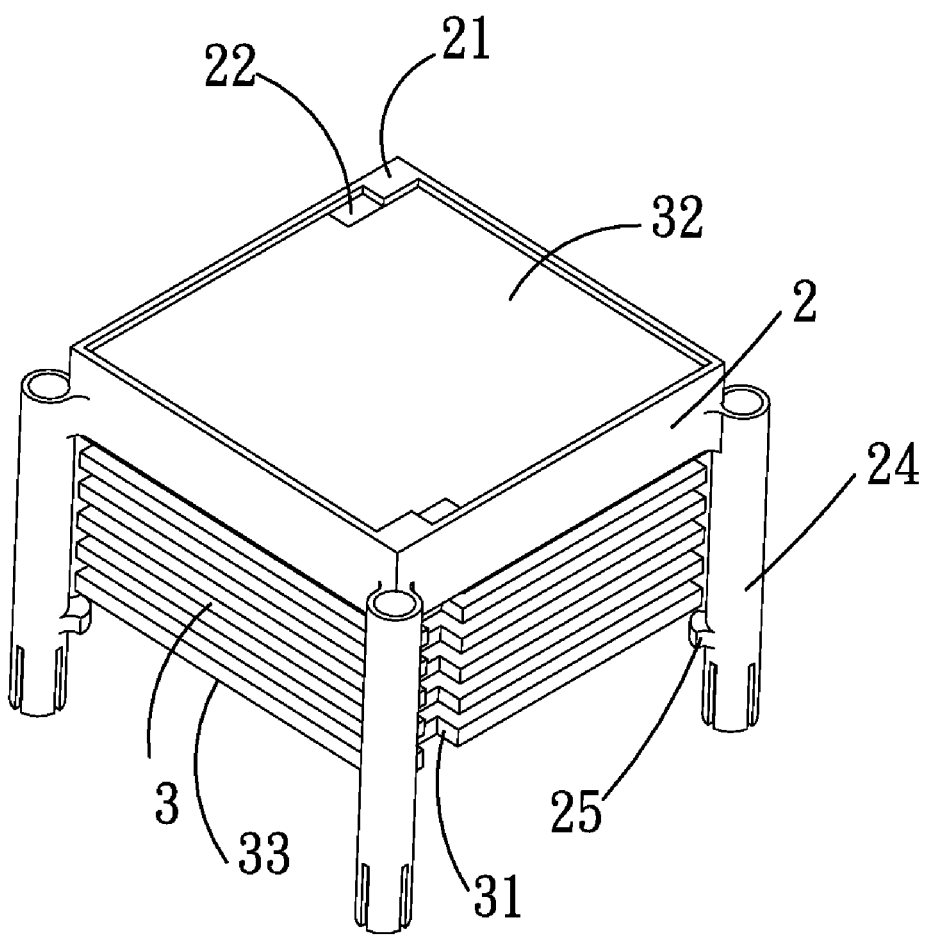
FIG. 4 is an assembled perspective view of the thermal module of the present invention with a smaller distance existed between an upward-facing side of the heat sink and the fixing rack.

Please refer to FIGS. 2 and 4 that are exploded and assembled perspective views, respectively, of a thermal module A according to a preferred embodiment of the present invention. As shown, the thermal module A includes a fixing rack 2 and a heat sink 3.

The fixing rack 2 is a square framework with a plurality of supporting legs 24 provided along an outer periphery thereof. The supporting legs 24 are each internally provided with a spring-loaded locating element (not shown) for the fixing rack 2 to support above the heat sink 3 and hold the heat sink 3 to a motherboard of an electronic device. The fixing rack 2 is provided at an inner side of the square framework with at least one stopper 21 and at least one projected portion 22. The stopper 21 may be flash with or slightly lower than an upper end surface 23 of the fixing rack 2. Please also refer to FIG.

2A that is an enlarged view of the circled area in FIG. 2. The projected portion 22 is located adjacent to the stopper 21, such that the projected portion 22 is parallel to but lower than the stopper 21 to vertically offset from the stopper 21 by a distance B.

The heat sink 3 is provided on an outer periphery thereof at a predetermined position with at least one vertically extended groove 31. The vertical groove 31 has a width slightly larger than that of the projected portion 22. The heat sink 3 is fitted in the fixing rack 2 to upward abut on the stopper 21 or the projected portion 22 of the fixing rack 2, so that the fixing rack 2 is restricted from sliding downward and may locate above the heat sink 3.

The heat sink 3 may be fitted in the fixing rack 2 in two modes. When the heat sink 3 is fitted in the fixing rack 2 in the first mode, the vertical groove 31 on the outer periphery of the heat sink 3 is located at a position corresponding to the projected portion 22, so that the projected portion 22 may slide into and engage with the groove 31, allowing the top surface 32 of the heat sink 3 to upward abut on the stopper 21. With the heat sink 3 fitted in the fixing rack 2 in this first mode, the fixing rack 2 is restricted from sliding downward to thereby stably support above the heat sink 3.

Figure 3:
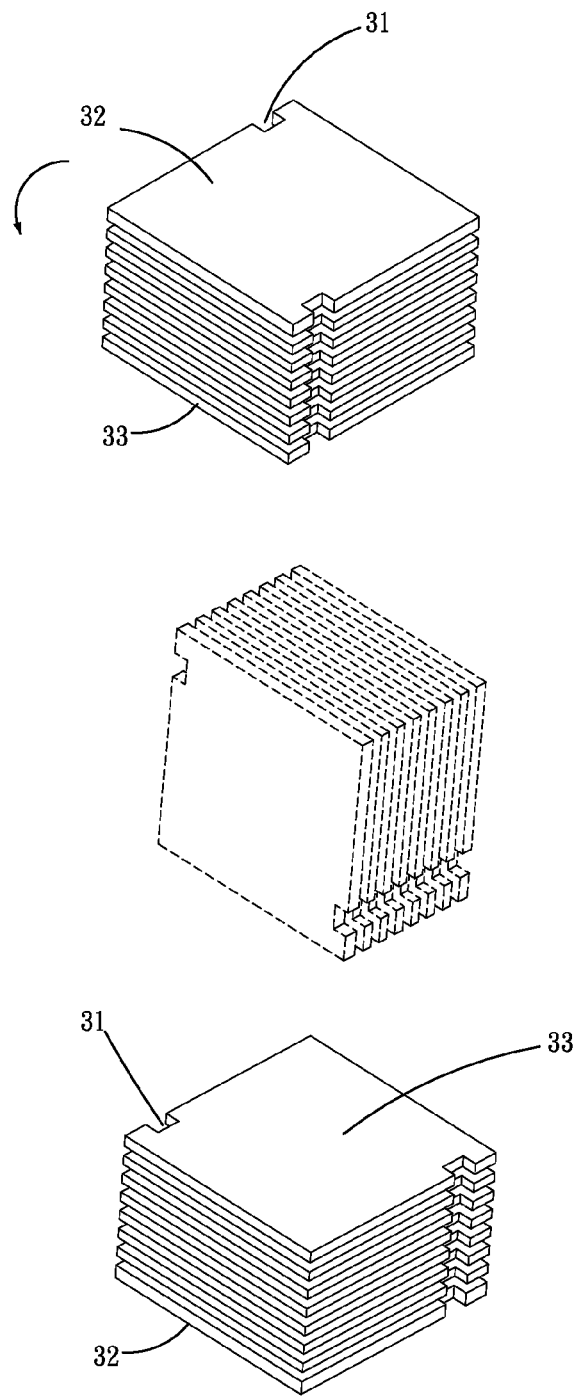
FIG. 3 shows the manner of vertically turning the heat sink of the thermal module of the present invention by 180 degrees.
Figure 5:
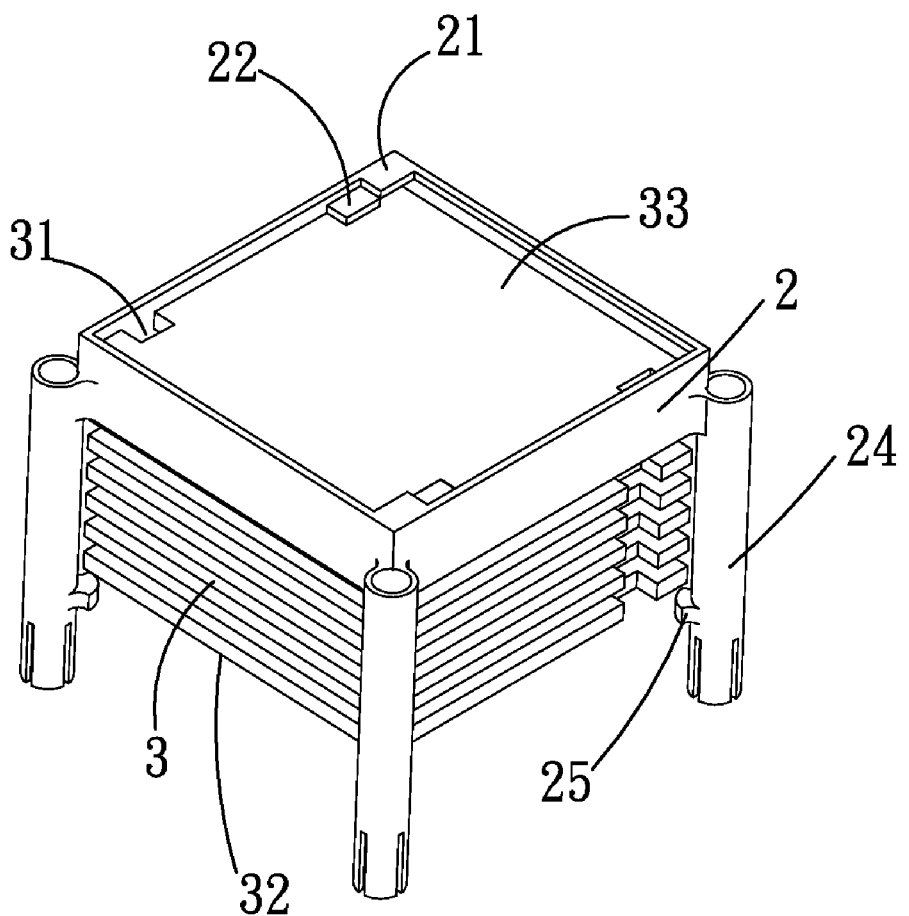
FIG. 5 is another assembled perspective view of the thermal module of the present invention with a larger distance existed between an upward-facing side of the heat sink and the fixing rack.

Alternatively, the heat sink 3 may be fitted in the fixing rack 2 in the second mode when it is desired to increase a distance between an upward-facing side of the heat sink 3 and the upper end surface 23 of the fixing rack 2. To do so, simply vertically turn the heat sink 3 by 180 degrees, as shown in FIG. 3, so that a bottom surface 33 of the heat sink 3 is turned to face upward. When the heat sink 3 is fitted in the fixing rack 2 in the second mode, the vertical groove 31 is horizontally offset from the projected portion 22 without being corresponding to the latter, so that the upward-facing bottom surface 33 of the heat sink 3 is upward abutted on the projected portion 22 to form a distance B between the upward-facing bottom surface 33 of the heat sink 3 and the upper end surface 23 of the fixing rack 2, as shown in FIG. 5. Therefore, with the vertical groove 31 provided on the heat sink 3 and the stopper 21 and the projected portion 22 provided in the fixing rack 2, the distance between the heat sink 3 and the fixing rack 2 of the thermal module A of the present invention may be adjusted.

Figure 6:
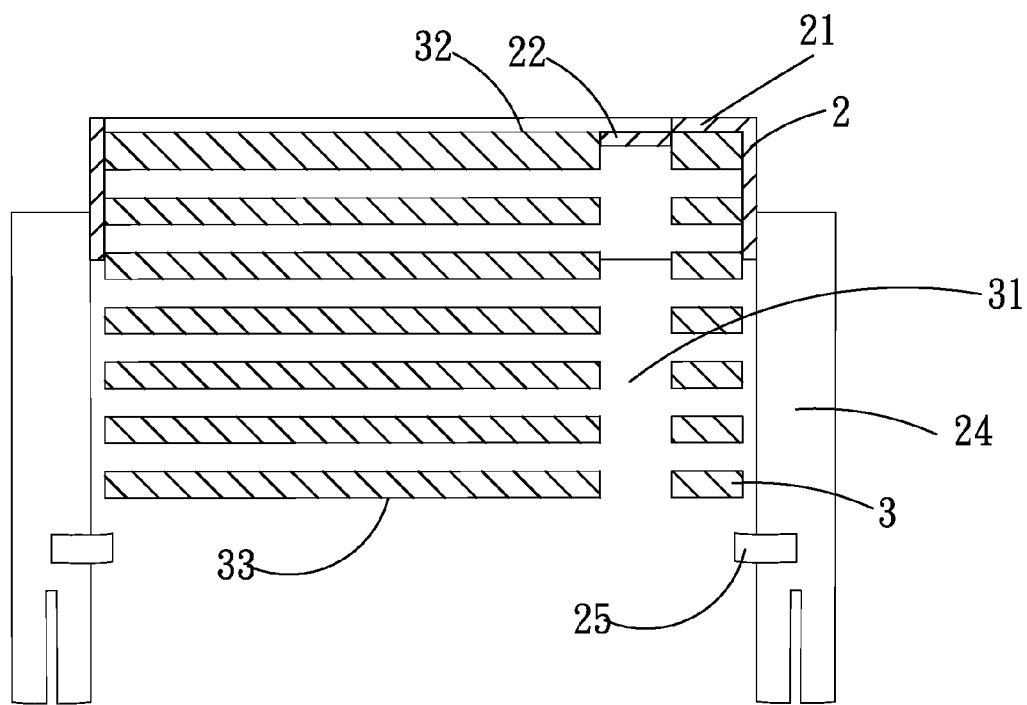
FIG. 6 is another assembled perspective view of the thermal module of the present invention specifically showing the vertical groove in an embodiment of the present invention.
Figure 7:
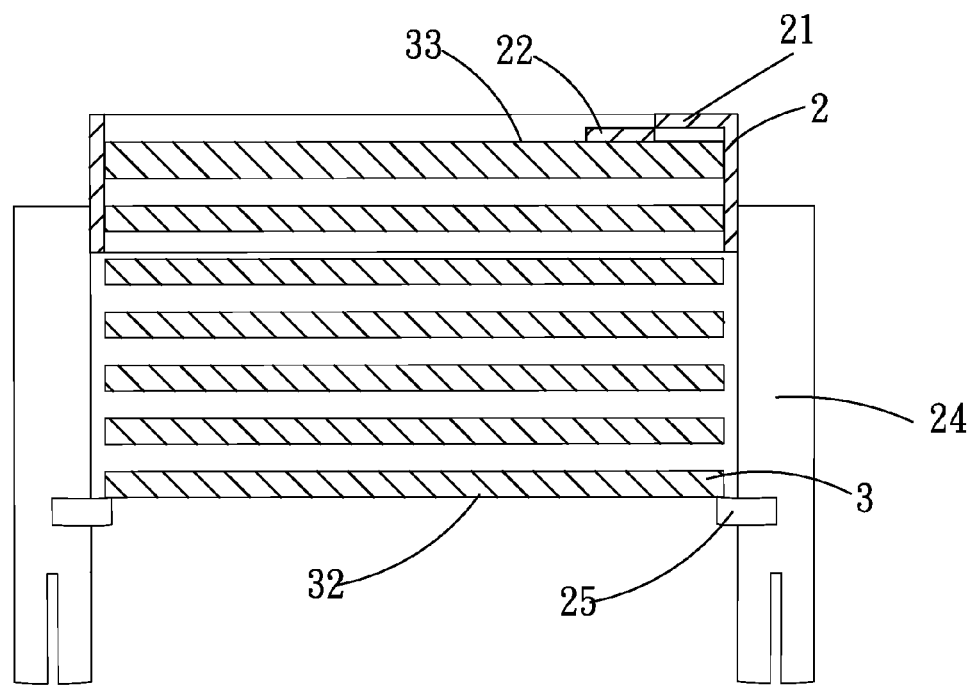
FIG. 7 is another assembled perspective view of the thermal module in an embodiment of the present invention.

With reference to FIGS. 6 and 7, in brief, the thermal module A of the present invention is provided on the fixing rack 1 with a stopper 21 and a projected portion 22 that are vertically offset from each other by a predetermined distance, and the heat sink 3 may be selectively fitted in the fixing rack 2 to upward abut an upward-facing side on the higher stopper 21 or the lower projected portion 22, so that a distance between the heat sink 3 and a cooling fan is adjustable according to actual need.

Moreover, the fixing rack 2 is provided on the supporting legs 24 with an inward projected holding portion 25 each for supporting the bottom surface 33 and the upper surface 32 of the heat sink 3 thereon when the heat sink 3 is fitted in the fixing rack 2 in the first and the second mode, respectively, so that the heat sink 3 is prevented from falling.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A thermal module comprising:
a fixing rack being provided at an inner side with at least one stopper and at least one projected portion located adjacent to the stopper, and the projected portion being parallel to but lower than the stopper, so that a height difference is existed between the stopper and the projected portion; and
a heat sink being fitted in the fixing rack and provided along an outer periphery with at least one vertically extended groove;
wherein when the heat sink is fitted in the fixing rack with an upper surface of the heat sink facing upward, the groove is located at a position corresponding to the projected portion on the fixing rack, allowing the projected portion to slide into the groove and the upper surface of the heat sink to upward abut on the higher stopper; and, when the heat sink is vertically turned by 180 degrees to fit in the fixing rack with a bottom surface of the heat sink facing upward, the groove on the heat sink is horizontally offset from the projected portion on the fixing rack, allowing the upward-facing bottom surface of the heat sink to upward abut on the lower projected portion, so that an increased distance is existed between the upward-facing bottom surface of the heat sink and the fixing rack due to the height difference between the stopper and the projected portion.

2. The thermal module as claimed in claim 1, wherein the vertical groove provided on the heat sink has a width slightly larger than that of the projected portion.

3. The thermal module as claimed in claim 1, wherein the fixing rack is provided with a plurality of supporting legs, and each of the supporting legs is provided with a holding portion, on which the heat sink is supported and thereby protected from falling.

* * * * *